United States Patent [19]

Iizuka et al.

[11] 4,293,868
[45] Oct. 6, 1981

[54] SEMICONDUCTOR DEVICE, METHOD OF MANUFACTURING THE SAME AND APPLICATION THEREOF

[75] Inventors: Takashi Iizuka, Takasaki; Masayuki Horie, Maebashi, both of Japan

[73] Assignee: Hitachi, Ltd., Tokyo, Japan

[21] Appl. No.: 9,968

[22] Filed: Feb. 6, 1979

[30] Foreign Application Priority Data

Oct. 30, 1978 [JP] Japan ............................ 53-132677

[51] Int. Cl.³ ............................................ H01L 27/02
[52] U.S. Cl. ..................................... 357/46; 357/13; 357/20; 357/51; 148/187; 29/577 E
[58] Field of Search ........................ 357/46, 13, 20, 51

[56] References Cited

FOREIGN PATENT DOCUMENTS

| 2335055 | 12/1977 | France | 357/46 |
| 2363897 | 5/1978 | France | 357/46 |

*Primary Examiner*—Edward J. Wojciechowicz
*Attorney, Agent, or Firm*—Craig and Antonelli

[57] ABSTRACT

This invention relates to a power transistor which includes a driving transistor and an output transistor in the Darlington connection. This invention has for its object to prevent the power transistor from being destroyed by a surge in such a way that a surge destruction-preventing Zener diode is connected between the base and the collector or the emitter of the power transistor. Especially, it is intended to dispose the Zener diode within a semiconductor substrate together with the power transistor. According to this invention, a p-n junction for the Zener diode is formed between a semiconductor region continuous to a collector region of the transistor and a semiconductor region continuous to a base region thereof. The p-n junction is surrounded by the base region of the transistor, whereby it is formed within a bulk and is prevented from reaching the surface of the semiconductor substrate.

12 Claims, 14 Drawing Figures

SEMICONDUCTOR DEVICE, METHOD OF MANUFACTURING THE SAME AND APPLICATION THEREOF

BACKGROUND OF THE INVENTION

This invention relates to a semiconductor device, particularly a monolithic semiconductor device including a driving transistor and an output transistor in the Darlington connection, and also to a method of manufacturing the semiconductor device and an application thereof.

In a case where a power transistor which includes a driving transistor and an output transistor in the Darlington connection is employed as an element for switching the current of an inductive load in, for example, an electronic ignition device of an automobile, a very great surge voltage is sometimes generated from the inductive load. When the surge voltage exceeds the breakdown voltage of the power transistor, the power transistor is destroyed in some cases.

By connecting a Zener diode between the base and collector or emitter of the power transistor, it is possible to prevent the power transistor from being destroyed due to the surge.

However, with a construction in which the Zener diode is connected outside the finished power transistor, the number of external components of the electronic device increases, and also the number of man-hours for assemblage increases.

The Zener diode for the above-described use must be selected so as to have a Zener voltage which is higher than the operating voltage of the power transistor to be protected and which is lower than the breakdown voltage of the power transistor to be protected. Therefore, it is subject to limitations in use.

It is more desirable that the Zener diode be formed integrally with the transistor to be protected.

SUMMARY OF THE INVENTION

An object of this invention is to provide a semiconductor device in which a Zener diode for preventing destruction due to a surge is contained without increasing the area occupied by the device.

Another object of this invention is to provide a semiconductor device which includes an integral Zener diode for attaining stabilized characteristics.

Still another object of this invention is to provide a method of manufacturing a semiconductor device containing therein a Zener diode having only small deviations in its characteristics.

A further object of this invention is to provide inductive load-driving means which can reduce the number of man-hours for assemblage and the number of assembly components, and which can enhance reliability.

In accordance with this invention, a p-n junction for a Zener diode is formed between a semiconductor region continuous to a collector region of a transistor and a semiconductor region continuous to a base region thereof. As will be stated later, the p-n junction is surrounded by the base region of the transistor, whereby it is formed within a bulk and does not get at the surface of a semiconductor substrate.

In the case of an inductive load such as ignition coil for an automobile, the Zener voltage of the Zener diode is set at a comparatively high voltage, for example, several hundreds volts in dependence upon the transistor to be protected.

If a Zener junction of such a high voltage reaches a semiconductor surface, the Zener characteristic is liable to deteriorate or change because the semiconductor surface is susceptible to external influences such as an electric field ascribable to undesirable ions. It will accordingly be difficult to obtain a transistor having stable characteristics.

In contrast, according to this invention, the base region of the transistor is arranged around the Zener junction, and the field strength at an end part of the Zener junction is moderated by the base region. The Zener junction is not subject to the influences of the semiconductor surface. The Zener junction is approximated substantially by a unidimensional model, and the breakdown junction area increases substantially to the geometrical area, so that the operating resistance becomes low.

According to this invention, the Zener diode can be arranged under a base electrode or an emitter electrode such as base bonding pad or emitter bonding pad. In consequence, according to this invention, the area of the semiconductor substrate is not increased even when the Zener diode is disposed therein.

According to this invention, the Zener diode (diodes) can be connected between the collector and base of the transistor or/and between the collector and emitter thereof.

In addition, according to this invention, a suitable method of manufacture can be employed.

Hereunder, this invention will be described in conjunction with embodiments.

DESCRIPTION OF THE PREFERRED EMBODIMENTS

Figure 1:
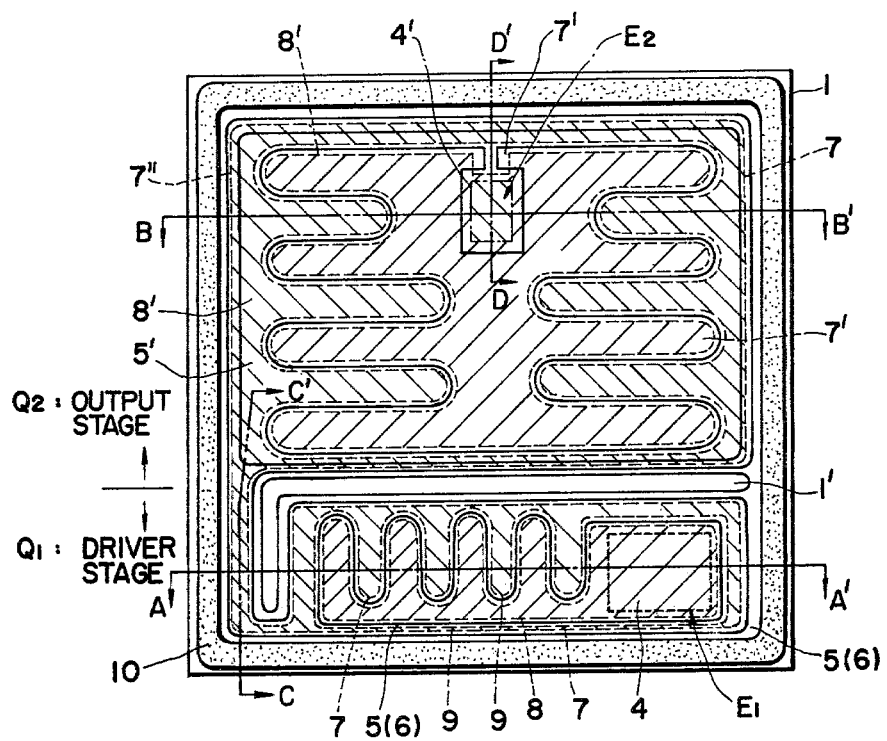
FIG. 1 is a plan view of a Darlington power transistor in an embodiment of this invention.

In FIG. 1, junction ends of semiconductor regions are indicated by solid lines, a Zener diode region is indicated by a part enclosed with one-dot chain lines, and electrode patterns made of, for example, aluminum are indicated by broken lines.

The aluminum electrodes are hatched in order to make the configuration definite.

In FIG. 1, an output transistor $Q_2$ is arranged at the upper part of the drawing, and a driving transistor $Q_1$ at the lower part.

Figure 5:
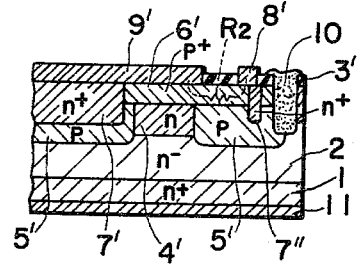
Figure 6:
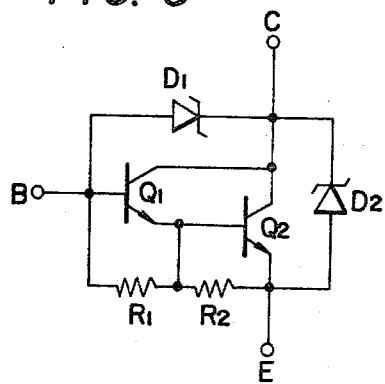
FIG. 6 is a diagram of the equivalent circuit of the Darlington power transistor.

As apparent from a circuit in FIG. 6, the driving transistor $Q_1$ and the output transistor $Q_2$ in the Darlington connection have their collectors made common. In FIGS. 1 to 5, an $n^-$-type semiconductor substrate 1 and an $n^+$-type layer 2 are used for the two transistors in common.

Although this is not essential, a deep groove 10 is formed in the peripheral part of a major surface of the semiconductor substrate 1, and it is filled with an insulator such as glass.

Figure 2:
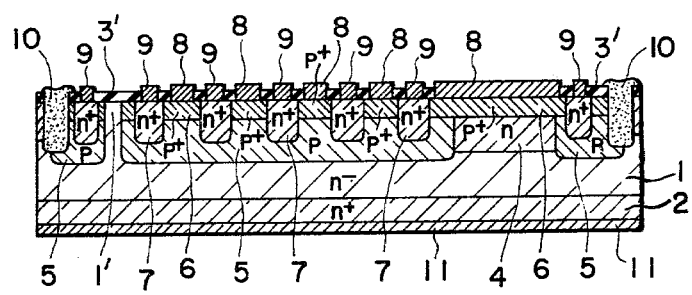
FIGS. 2, 3, 4 and 5 are sectional views taken along lines A—A', B—B', C—C' and D—D' in FIG. 1, respectively.

As shown in FIG. 2, the driving transistor $Q_1$ has a p-type base region 5 which is formed in the major surface of the semiconductor substrate 1, and a $p^+$-type region 6 at a high impurity concentration which is continuous to the base region 5 and which serves for a base electrode contact. An end part of a base junction which is defined by the base region 5 and the semiconductor substrate 1 at the peripheral part of the semiconductor substrate 1 is caused to reach the bottom of the groove 10.

A part $E_1$ the extent of which is indicated by one-dot chain lines in FIG. 1 is not formed with the p-type base region 5 and is enclosed with this region 5. As seen from FIG. 2, an n-type region 4 which is continuous to the $n^-$-type semiconductor substrate 1 and which has an impurity concentration higher than that of the $n^-$-type semiconductor substrate 1 is formed underneath the $p^+$-type region 6 corresponding to the area $E_1$.

The part $E_1$ is arranged in the range of a base bonding pad.

Since the n-type region 4 and the $p^+$-type region 6 have the comparatively high impurity concentrations respectively, a p-n junction defined by these regions 4 and 6 exhibits a comparatively low breakdown voltage and acts as a Zener junction.

Figure 3:
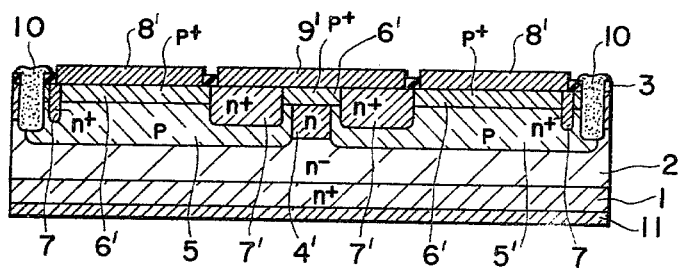

As shown in FIG. 3, the output transistor $Q_2$ has a p-type base region 5' which is formed in the major surface of the semiconductor substrate 1, and a $p^+$-type region 6' at a high impurity concentration which is continuous to this base region 5' and which serves for a contact.

As in the foregoing, a part $E_2$ the extent of which is indicated by one-dot chain lines in FIG. 1 is not formed with the p-type base region 5' and is enclosed with this region 5'. As seen from FIGS. 3 and 5, an n-type region 4' is formed underneath the $p^+$-type region 6' corresponding to the area $E_2$. Another Zener junction is defined by the n-type region 4' and the $p^+$-type region 6'.

The part $E_2$ is arranged in the range of an emitter bonding pad.

In a place indicated at 1' in FIG. 1, none of the base regions 5 and 5' and the $p^+$-type regions 6 and 6' is formed and the semiconductor substrate 1 extends up to the surface.

Accordingly, the base region 5 and the $p^+$-type region 6 of the driving transistor $Q_1$ and the base region 5' and the $p^+$-type region 6' of the output transistor $Q_2$ are electrically isolated from each other in the place 1'. However, the base regions 5 and 5' or the $p^+$-type regions 6 and 6' of the two transistors $Q_1$ and $Q_2$ are continuous to each other at a position which is close to the left lower side of the plan of FIG. 1. Although this is not essential, they are also continuous at a position close to the right side of the plan.

An $n^+$-type emitter region 7 of the driving transistor $Q_1$ is formed in the surface of the base region 5. The $n^+$-type emitter region 7 is continuous to an $n^+$-type region arranged around an $n^+$-type emitter region 7' of the output transistor $Q_2$ and apart from this emitter region 7', through an $n^+$-type region formed in the surface of the p-type region close to the left side in FIG. 1.

As shown in FIG. 1, the emitter region 7' of the output transistor $Q_2$ has a hole which surrounds the part $E_2$ indicated by the one-dot chain lines, and a groove which is continuous to the hole and which extends upwards as viewed in the drawing.

An insulating film 3' such as silicon dioxide film is formed on the surfaces of the semiconductor substrate and the respective regions. A common collector electrode 11 is formed on the surface of the $n^+$-type region 2.

An electrode 8 made of aluminum or the like lies in contact with the surface of the $p^+$-type region 6 which is enclosed with the emitter region 7 of the driving transistor $Q_1$. The electrode overlying the part 4 is made the base bonding pad as stated previously.

An emitter electrode 9 lies in contact with the surface of the emitter region 7 of the driving transistor $Q_1$. The emitter electrode 9 contacts with an $n^+$-type region arranged in the vicinity of the left side in FIG. 1, extends onto the $n^+$-type region and continues to a base electrode 8' of the output transistor $Q_2$.

Figure 4:
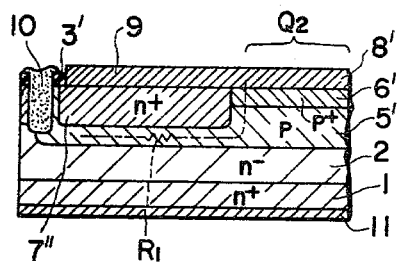

As shown in FIG. 4, the $n^+$-type region 7" and the p-type region 6' are short-circuited by the electrode 9 or the base electrode 8' of the output transistor. As a result, the $p^+$-type region and the p-type region in the vicinity of the left side in FIG. 1 are connected between the base and emitter of the driving transistor. The lateral resistance of these regions becomes a resistance $R_1$ as indicated in FIG. 6.

An emitter electrode 9' lies in contact with the emitter region 7' of the output transistor. As shown in FIGS. 1, 3 and 5, the emitter electrode 9' extends onto the $p^+$-type region 6' in the area $E_2$ and also contacts with this region 6'. As shown in FIG. 1, however, the emitter electrode 9' does not extend onto the groove of the emitter region 7'.

As indicated in FIG. 5, a resistance $R_2$ exhibited by the $p^+$-type region 6' and the base region 5' is included between the base electrode 8' and the emitter electrode 9' of the output transistor $Q_2$. The emitter electrode 9' on the part $E_2$ is made the emitter bonding pad.

As apparent from FIG. 2, the Zener junction defined by the n-type region 4 and the $p^+$-type region 6 is connected between the common collector electrode 11 and the base electrode 8.

On the other hand, the Zener junction defined by the n-type region 4' and the $p^+$-type region 6' is connected between the common collector electrode 11 and the emitter electrode 9' as shown in FIG. 5.

The substrate as above described is fixed to a stem (not shown) by the well-known brazing technique. One end of a connector wire made of aluminum or the like is bonded to the bonding pad, while the other end of the connector wire is bonded to the corresponding lead of the stem.

The equivalent circuit of the device becomes as shown in FIG. 6.

According to this embodiment explained above, the objects can be achieved on the following grounds.

Since the base of the driving transistor forms the base electrode of the Darlington power transistor, a wire bonding portion must be disposed. A semiconductor region underneath the bonding portion is usually an inactive region which does not execute an action as a transistor.

The Zener diode is disposed beneath this bonding region, so that an effective utilization of the inactive region is achieved and so that the Zener diode can be contained without increasing the occupying area.

Since the Zener diode is arranged between the base electrode disposed on the front surface and the collector electrode disposed on the rear surface, the current path shortens, and the "on" resistance can be made low. Therefore, the fluctuation of the breakdown voltage attributed to a current fluctuation can be made small, and a reliable prevention of the destruction due to a surge can be expected.

Since the Zener diode is put into the bulk breakdown type, the fluctuation of the breakdown voltage under the influence of surface charges can be ignored, and a reliable operation of preventing the destruction ascribable to the surge can be realized. Since the p$^+$-n junction of the Zener diode is surrounded by the collector-base junction deeper than the p$^+$-n junction, the base region moderates the field strength, a unidimensional model holds and the setting of a withstand voltage is facilitated.

In a case where the power transistor containing the Zener diode therein is employed as drive means for interrupting the current of an inductive load, such as an ignition device for an automobile, the requirement of mounting the Zener diode externally can be avoided by using the present invention. Therefore, the number of assembly components and the number of man-hours for assemblage can be reduced. Since the occurrence of inferior soldering etc. in the case of externally mounting the Zener diode is preventable, the enhancement of reliability can be achieved.

Figure 7:
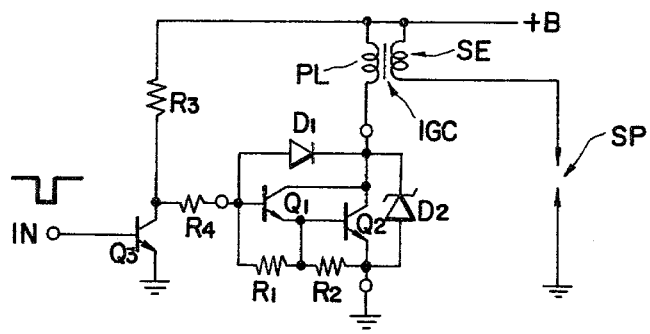
FIG. 7 is a circuit diagram of an ignition device utilizing the transistor circuit of the present invention.

FIG. 7 shows a circuit of an ignition device for an automobile which employs the transistor of this invention. Referring to FIG. 7, a pulse signal for ignition is applied to the base of a transistor $Q_3$, and the transistor of this invention is driven by the collector output of the transistor $Q_3$. The primary winding of an ignition coil is connected between the collectors of the transistors $Q_1$ and $Q_2$ and a power supply $+B$, and the secondary winding is connected between the power supply $+B$ and a sparking plug SP.

The pulse signal which brings the transistor $Q_3$ into the "off" state turns the transistors $Q_1$ and $Q_2$ "on". Current flows through the primary winding of the ignition coil, and a high voltage is induced across the secondary winding.

The transistor is subjected to voltages and currents of comparatively great magnitudes which are induced in the primary winding with the on/off of the primary current of the ignition coil, and voltages and currents which are attributed to energies kicked back from the secondary winding side onto the primary winding side at the discharge of the secondary winding, etc.

In an experiment, the transistor of this invention demonstrated sufficient ultimate strength characteristics against such surges.

In particular, when using the transistor of this invention, the current and voltage waveforms of the transistor were satisfactorily good.

On the other hand, a Zener diode of comparatively high operating resistance unlike the Zener diode of low operating resistance as in this invention was used by way of the same experiment. Then, although the reason was not clearly known, it was noted that linking was caused in the signal waveform by the kick-back as stated above.

According to this invention, a method of manufacturing the transistor as above described is provided.

In this method of manufacture, it is taken into account that the control of the characteristics of the Zener diode will be facilitated and that a process for manufacturing the transistor which has heretofore been employed and which has not used the present invention will not alter greatly.

FIGS. 8(a)–(g) are sectional views in various manufacturing steps which illustrate an embodiment in the case of disposing the Zener diode between the base and collector of the transistor. That is, they are sectional views of manufacturing steps for forming the driving transistor and the Zener diode which constitute the Darlington power transistor.

Figure 8A:
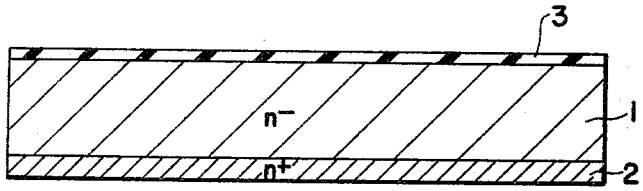
FIGS. 8(a) and 8(g) are sectional views at various steps of a method of manufacturing a Darlington power transistor in an embodiment of this invention.

First of all, as shown in FIG. 8(a), there is prepared an n$^-$-type semiconductor substrate in which a highly doped n$^+$-type collector layer 2 is formed in the lower major surface by, for example, the impurity diffusion and a silicon dioxide film 3 is formed on the upper major surface. Although not restricted, a substrate 1 is a silicon substrate having a specific resistance of 45 Ωcm and a thickness of 250 μm. The oxide film 3 is formed by the well-known thermal oxidation process, and is 0.7 μm thick by way of example.

Figure 8B:
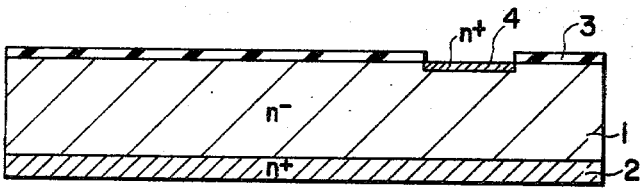

Subsequently, as shown in FIG. 8(b), the oxide film 3 in an area corresponding to the bonding part of a base electrode of a driving transistor is selectively removed by the well-known photoetching process. Using the resultant oxide film 3 as a mask, phosphorus (P) being an n-type semiconductor impurity is injected into the exposed surface of the silicon substrate 1 by the ion implantation process so that the concentration may become, for example, $1.4 \times 10^{13}$ atoms/cm$^2$. Thus, an n$^+$-type region 4 is formed.

Figure 8C:
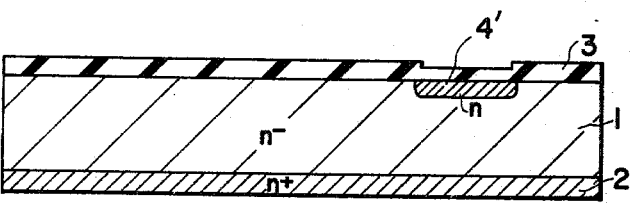

As shown in FIG. 8(c), the resultant substrate 1 is heated in an oxygen atmosphere at, for example 1,000° C. In this way, the impurity of the semiconductor region 4 is thermally diffused into an n-type semiconductor region 4', and a new oxide film is simultaneously formed on the surface thereof.

Figure 8D:
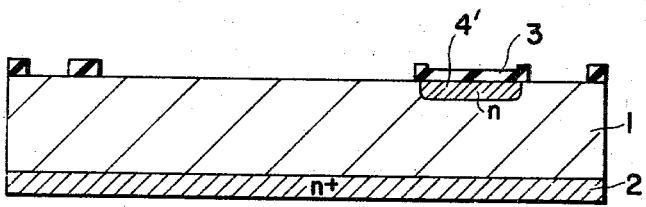

As shown in FIG. 8(d), in order to partly form a base region later, selected areas of the oxide film 3 are removed by the photoetching. In this case, in order to prevent the impurity concentration of an n-type semiconductor region 4" to-be-finally-formed from being affected by the impurity at the diffusion of the base, the SiO$_2$ film 3 is left on the n-type semiconductor region 4' lest the impurity for forming the base region later should diffuse.

In FIG. 8(d), a window provided apart on a left-side part serves to form a p-type semiconductor region for connecting the base of the driving transistor and the base of an output transistor.

Figure 8E:
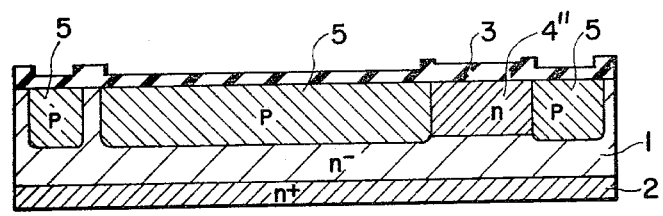

As shown in FIG. 8(e), using the oxide film 3 as a mask, boron which is a p-type semiconductor impurity is deposited, whereupon the base diffusion is carried out by a heat treatment to form p-type regions 5 which has a resistance of 135 Ω/□ and a depth of 30 μm by way of example. In the heat treatment, the impurity in the n-type region 4' is turned into the n-type region 4". During the heat treatment, the oxide film 3 is formed anew on the surface of the base region 5.

Figure 8F:
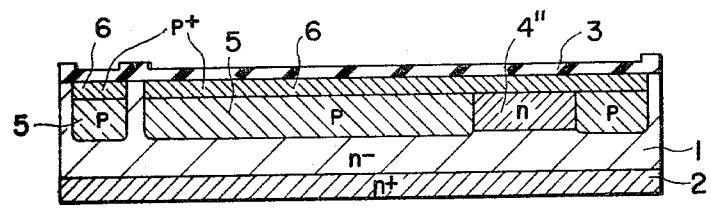

As shown in FIG. 8(f), the oxide film 3 overlying the base region 5 and the n-type region 4" is selectively removed by the photoetching process, whereupon boron is diffused at a high impurity concentration in an oxidizing atmosphere, thereby to form a p$^+$-type semiconductor region 6 for a base contact. A Zener diode is constructed of the n-type region 4" and the p$^+$-type region 6 formed thereon.

Figure 8G:
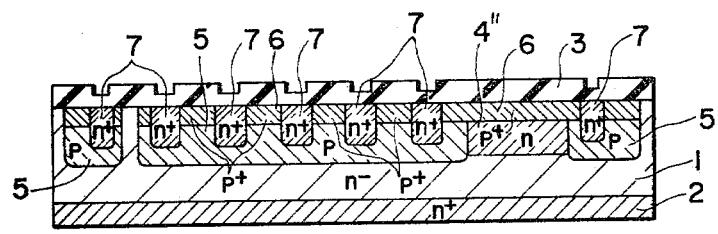

As shown in FIG. 8(g), phosphorus is diffused into the base region 6 by the selective semiconductor impurity diffusion similar to the above, to form an n+-type emitter region 7.

Subsequently, a PSG (phospho-silicate-glass) film is formed on the surface of the substrate 1 by the CVD (chemical vapor deposition) process. At the next stage, a deep groove is formed in the peripheral part of the substrate 1 by the selective etching, and phosphorus glass is introduced into the groove by the electrophoresis and then heat-treated, thereby to form an insulator (10 in FIGS. 1 to 5). This intends to diminish a leakage current by making thick the insulator on the surface of the end of the base-collector junction.

An electrode hole is formed in the PSG film and the oxide film, and an aluminum film is evaporated in order to form the base electrode 8 and an interconnection for connecting the emitter of the driving transistor and the base of the output transistor. Subsequently, selected areas of the evaporated aluminum film are removed. Although not especially restricted, the selective removal can be carried out by a mechanical removal method which exploits the decrease of the thickness of the aluminum film at the stepped part between the electrode hole and the insulating film (3') and the difference of the bonding strengths of the aluminum layer with the silicon surface and the insulating film.

Subsequently, the collector electrode 11 is formed on the rear surface of the substrate 1. As a result, the device is completed as illustrated in FIG. 2.

According to the manufacturing method described above, the impurity concentration of the n-type region 4" is determined by the ion implantation, and the impurity for forming the base region is not diffused into the portion to form this n-type region 4". In consequence, the impurity concentration of the n-type region 4" can be decided at high precision.

Since the n-type region 4" is formed by the ion implantation as stated above, the Zener voltage of the Zener diode to be formed can be easily controlled so as to become lower than the base-collector withstand voltage of the transistor substantially by a predetermined value.

The semiconductor device has the construction in which the Zener diode is arranged under the bonding pad. Therefore, the manufacturing steps after the formation of the emitter region may be made the same as in the manufacturing process having heretofore been employed, and it is unnecessary to alter the shape of the emitter region, the shape of the electrode, etc. Accordingly, manufacturing equipment, inspection apparatus etc. having heretofore been employed can be used.

By inverting the conductivity types of the semiconductor regions and the substrate thus far described, a Zener diode can be disposed for a p-n-p power transistor.

What is claimed is:

1. A monolithic semiconductor device having a transistor and a Zener diode comprising:
   a semiconductor substrate of a first conductivity type, having a low impurity concentration, serving as the collector of said transistor, and having a plane major surface;
   a first semiconductor region of a second conductivity type opposite to said first conductivity type, disposed in a first prescribed area of said major surface except a second prescribed area of said major surface adjacent to said first prescribed area, said first semiconductor region extending to a first predetermined depth into said semiconductor substrate from said major surface, and serving as the base of said transistor;
   a second semiconductor region of said first conductivity type, formed in said first semiconductor region, extending to a second predetermined depth into said first semiconductor region from said major surface, and serving as the emitter of said transistor;
   a third semiconductor region of said second conductivity type, formed in said first semiconductor region except said second semiconductor region formed therein, having an impurity concentration higher than that of said first semiconductor region, said third semiconductor region extending to a third predetermined depth into said first semiconductor region from said major surface, and serving as the base contact region of said transistor;
   a fourth semiconductor region of said second conductivity type, disposed in said second prescribed area of the major surface, extending to a fourth predetermined depth into said semiconductor substrate from said major surface, said fourth semiconductor region having an impurity concentration higher than that of said first semiconductor region, and serving as the contact region for one electrode of said Zener diode;
   a fifth semiconductor region of said first conductivity type, formed in a portion of said semiconductor substrate immediately beneath said fourth semiconductor region adjacently to said fourth semiconductor region, said fifth semiconductor region defining a PN junction with said fourth semiconductor region, and having an impurity concentration higher than that of said semiconductor substrate, said PN junction defining the Zener-voltage of said Zener diode;
   a first metal electrode disposed on said second semiconductor region and serving as the emitter electrode of said transistor;
   a second metal electrode disposed on said third semiconductor region and serving as the base electrode of said transistor; and
   a third metal electrode disposed on said fourth semiconductor region and serving as the electrode of said Zener diode.

2. A monolithic semiconductor device according to claim 1, wherein said fourth semiconductor region is laterally extended to said third semiconductor region so as to be contiguous thereto, and said third metal electrode is integrated with said second metal electrode so that said Zener diode is connected between the base of said transistor and the collector thereof.

3. A monolithic semiconductor device according to claim 2, wherein said third and fourth semiconductor regions are formed at the same time, and said third predetermined depth is equal to said fourth predetermined depth.

4. A monolithic semiconductor device according to claim 3, wherein said fifth semiconductor region is laterally extended to said first semiconductor region so as to define a PN junction therewith.

5. A monolithic semiconductor device according to claim 1, wherein said third metal electrode is connected to said first metal electrode so that said Zener diode is connected between the emitter of said transistor and the collector thereof.

6. A monolithic semiconductor device according to claim 1, wherein the first predetermined depth of said first semiconductor region is deeper in the substrate than the depth of the PN junction formed by the fourth and fifth semiconductor regions.

7. A method of manufacturing a monolithic semiconductor device having a transistor and a Zener diode, comprising the steps of:

preparing a semiconductor substrate of a first conductivity type, said semiconductor substrate having a low impurity concentration, said substrate having a major surface and serving as a collector semiconductor region for said transistor;

selectively introducing impurities of said first conductivity type into said semiconductor substrate through a first area of said major surface to form a highly doped first conductivity type region having an impurity concentration higher than that of said semiconductor substrate;

selectively introducing impurities of a second conductivity type opposite to said first conductivity type into said semiconductor substrate through a second area of said major surface adjacent to said first area to form a base semiconductor region for said transistor which base region surrounds said highly doped first conductivity type region;

introducing impurities of said second conductivity type into said highly doped first conductivity type region and said base semiconductor region through said first and second areas to form a base contact region in said base semiconductor region and to form a second conductivity region of a Zener diode having an impurity concentration higher than said base region to define a PN junction with said highly doped first conductivity type region, said PN junction defining the Zener-voltage of said Zener diode; and selectively introducing impurities of said first conductivity type into said base semiconductor region to form an emitter semiconductor region defining a PN junction with said base semiconductor region.

8. A method of manufacturing a monolithic semiconductor device according to claim 7, wherein a metal electrode is formed on said base contact region and one region of the Zener diode so as to connect the Zener diode between the base and collector semiconductor regions.

9. A method of manufacturing a monolithic semiconductor device according to claim 7, wherein said selectively introducing step to form the highly doped region is effected by implantation of ions of the impurities.

10. A method of manufacturing a monolithic semiconductor device according to claim 7, wherein a metal electrode is formed on one region of the Zener diode and extends over said emitter semiconductor region so as to connect the Zener diode between the collector and emitter semiconductor regions.

11. A monolithic semiconductor device according to claim 1, wherein said first prescribed area of said major surface surrounds said second prescribed area.

12. A method of manufacturing a monolithic semiconductor device according to claim 7, wherein said first prescribed area of said major surface surrounds said second prescribed area.

* * * * *